United States Patent [19]

Kita et al.

[11] Patent Number: 4,701,997
[45] Date of Patent: Oct. 27, 1987

[54] METHOD OF MAKING PHOTO-ELECTRIC CONVERTING ELEMENTS

[75] Inventors: Ryusuke Kita, Tenri; Satoshi Nishigaki; Shuhei Tsuchimoto, both of Nara, all of Japan

[73] Assignee: Sharp Kabushiki Kaisha, Osaka, Japan

[21] Appl. No.: 894,943

[22] Filed: Aug. 8, 1986

[30] Foreign Application Priority Data

Aug. 8, 1985 [JP] Japan .............................. 60-176767

[51] Int. Cl.⁴ .......................................... H01L 31/18
[52] U.S. Cl. ........................................ 437/5; 427/76; 437/83
[58] Field of Search .................... 29/572, 591; 427/76, 427/88

[56] References Cited

FOREIGN PATENT DOCUMENTS

| | | | |
|---|---|---|---|
| 58-126539 | 7/1983 | Japan | 29/572 |
| 58-150955 | 9/1983 | Japan | 29/572 |
| 60-10667 | 1/1985 | Japan | 29/572 |
| 861021 | 5/1957 | United Kingdom . | |
| 1003365 | 5/1962 | United Kingdom . | |
| 2150351A | 11/1984 | United Kingdom . | |

Primary Examiner—Aaron Weisstuch
Attorney, Agent, or Firm—Birch, Stewart, Kolasch & Birch

[57] ABSTRACT

A method of making a photo-electric converting element which includes the steps of forming a photoconductive layer on an insulative substrate by applying a single substance of Group II–VI compound semiconductors which include Cd, or two or more Group II–VI compound powders; and then baking to form a photoconductive layer having a thickness of 1 to 10 μm and a surface roughness of 0.2 to 1 μm and also having its peripheral edge tapered outwardly with respect to the substrate at an angle not greater than 60° and forming a counterelectrode by the use of a lift-off technique so as to overlay a portion of the photoconductive layer.

13 Claims, 6 Drawing Figures

METHOD OF MAKING PHOTO-ELECTRIC CONVERTING ELEMENTS

BACKGROUND OF THE INVENTION

1. Field of the Invention

The present invention generally relates to a method of making a photo-electric converting element having an elongated configuration or a large surface area, and more particularly, to a method of making the photo-electric converting element suited for use as a contact-type image sensor.

2. Description of the Prior Art

The use of amorphous silicon or the like has been suggested as a material for an electroconductive thin-film for use in the manufacture of an elongated image element. However, since the output signal current is very weak, a storage-type read-out system is employed. In order to attain high-speed operation in this system, switches for selecting pixels must be used for each pixel, and therefore, the use of the plural switches renders the manufacturing cost high.

On the other hand, a contact-type image sensor utilizing photoconductive layers of CdS, CdSe or the like can give a sufficiently high signal output, and therefore, not only can a real-time read-out system be employed therefor, but a matrix drive system can also be used for driving the image sensor. This in turn brings about an advantage in that the number of switching elements required can be reduced.

However, the formation of the photoconductive layer of CdS, CdSe or the like by the use of the known vacuum deposition technique has a problem in that deviation from the stoichiometric composition tends to vary with the manufacturing conditions, with the consequence that the reproducibility thereof is lowered.

When the photoconductive layer is formed by the use of a sintering technique wherein the photoconductive layer is formed by sintering on an electrode pattern which has been formed on the substrate, not only must the material for the electrodes be of a type having such a high heat resistance as to withstand the atmosphere in which it is subsequently activated, but also it is difficult to keep good contact between the photoconductive layer and the electrodes. Moreover, since the photoconductive layer formed by the vacuum deposition technique has its peripheral edge steeply inclined from the glass substrate, not only is it difficult to use a lift-off technique in the formation of the electrodes, but also portions of the electrodes between the photoconductive layer and the substrate tend to be broke off, causing the electric connection to fail with an external circuit.

SUMMARY OF THE INVENTION

The present invention has been developed with a view towards substantially eliminating the above discussed problems inherent in the conventional manufacture of the photo-electric converting elements and has for its essential object to provide an improved method effective for the manufacture on a mass production basis and at reduced cost of the photo-electric converting elements for use in, for example, a contact-type planar image sensor.

In order to accomplish this object, the present invention provides a method of making a photo-electric converting element which utilizes the change in resistance of a photoconductive element to convert optical information into an electric signal proportional to the intensity of light of the optical information. The method herein disclosed according to the present invention comprises the steps of forming a photoconductive layer on an insulative substrate and forming a counter-electrode by the use of a lift-off technique so as to overlay the photoconductive layer. The formation of the photoconductive layer is carried out by applying to the insulative substrate a single substance of Group II–VI compound semiconductors including Cd, or two or more Group II–VI compound powders, followed by the baking thereof to form a photoconductive layer that is 1 to 10 $\mu$m in thickness and has a surface roughness of 0.2 to 1 $\mu$m and also has its peripheral edge tapered outwardly with respect to the substrate at an angle not greater than 60°. More specifically, in a preferred embodiment of the present invention herein disclosed, the photoconductive element is comprised of a photoconductive layer made of CdSe or a photoconductive element containing CdSe. CdSe or the photoconductive element containing CdSe used to form this photoconductive layer is prepared from a CdSe powder of 0.2 $\mu$m average particle size, which has been precipitated by the use of a chemical precipitation method, which powder is added with 0.1 to 1 mol % of $CuCl_2$ and/or AgCl as impurities and then heat-treated for 30 to 60 minutes at 600° to 800° C. in an atmosphere of inert gas so that it can be activated to have a photoconductive properly. The photoconductive layer made of CdSe or the photoconductive material containing CdSe is formed so as to have a thickness of 1 to 10 $\mu$m and a surface roughness of 0.2 to 1 $\mu$m with its peripheral edge tapered outwardly with respect to the substrate at an angle not greater than 60°. The overlying electrode is formed by the use of a lift-off technique. The material for the electrode may be a single element or an alloy of Ti, Ta, and Mo, and the insulating substrate may be employed in the form of a Pyrex glass substrate, or an alumina substrate. The above mentioned material for the electrode can exhibit good adhesion to the substrate and the photoconductive layers even though the temperature of the substrate remains the same as the ambient temperature, and therefore, the electrode can be satisfactorily formed by the use of the lift-off technique.

According to the above described method of the present invention, since the photoconductive layer is formed by applying a photoconductive paste to the substrate by the use of a screen printing technique and then baking, and the electrode is subsequently formed by the use of the lift-off technique, the photoconductive layer is no longer exposed to any etchant and the element can be easily formed at reduced cost with substantailly no possibility of electrode breakdown in the vicinity of the peripheral edge of the photoconductive layer.

BRIEF DESCRIPTION OF THE DRAWINGS

This and other objects and features of the present invention will become readily understood from the following description taken in conjunction with a preferred embodiment thereof with reference to the accompnaying drawings, in which.

DETAILED DESCRIPTION OF THE EMBODIMENT

Figure 2:
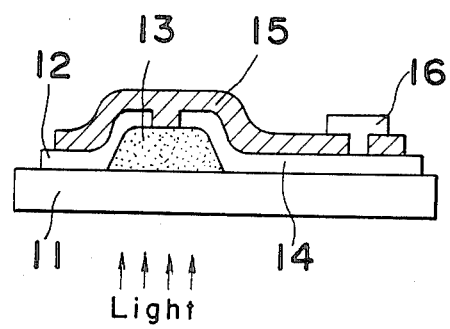
FIG. 2 is a schematic sectional view of the photo-electric converting element shown in FIG. 1.
Figure 1:
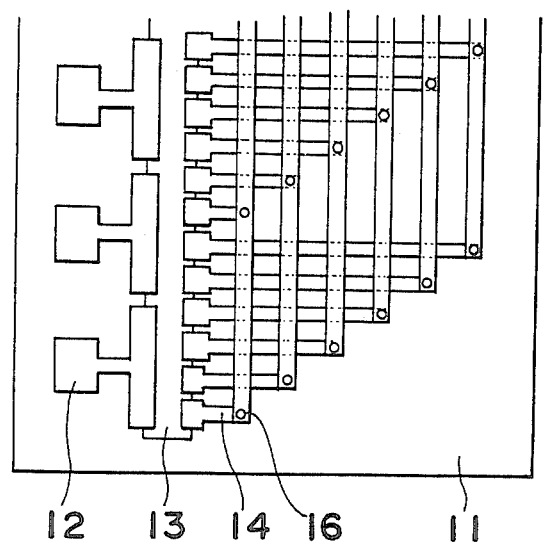
FIG. 1 is a schematic top plan view showing the structure of a photo-electric converting element formed by the method according to the present invention.

Referring first to FIGS. 1 and 2, reference numeral 11 represents an insulative substrate, reference numeral 12 represents common electrodes, reference numeral 15 represents an insulating layer, and reference numeral 16 represents matrix wirings. A contact-type image element is comprised of the common electrodes 12, a photoconductive layer 13 and strip-shaped electrodes 14 all formed on the substrate 11 and divided into a plurality of blocks with the electrodes 14 in one block connected with the respective electrodes 14 in the other block or blocks through the associated matrix wirings 16.

Figure 3:
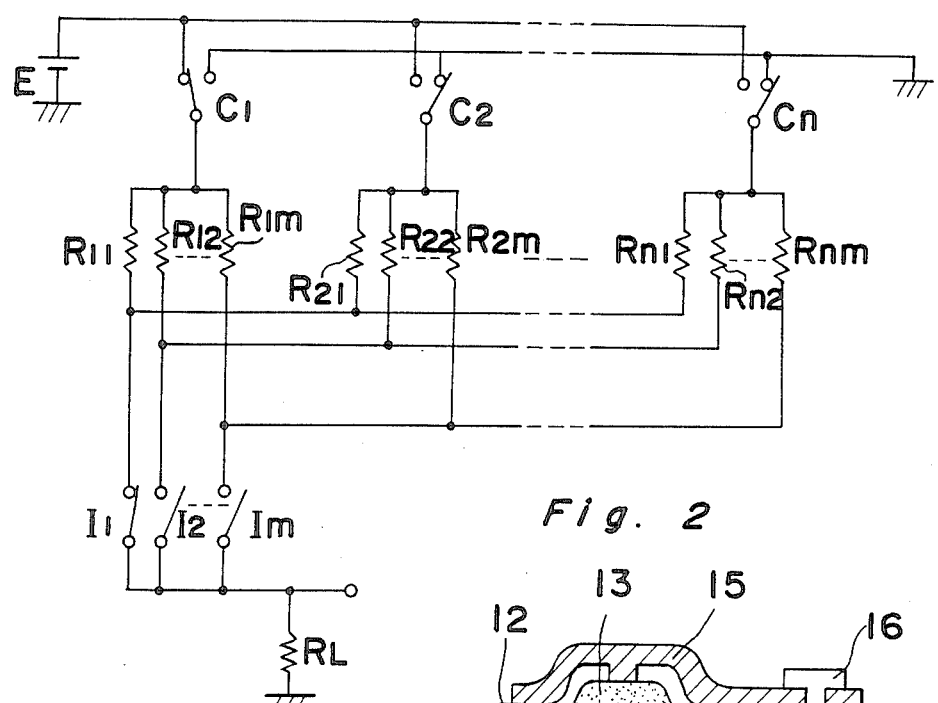
FIG. 3 is a diagram showing an equivalent circuit of a contact-type image element assembled by the use of the photo-electric converting elements manufactured according to the method of the present invention.

A basic electric equivalent circuit of the contact-type image element manufactured according to the present invention is shown in FIG. 3. Reference characters R11, R12, . . . and R1m, R21, R22, . . . and R2m, and Rn1, Rn2, . . . and Rnm represent photoconductive elements, reference characters C1, C2, . . . and Cn represent common switches, reference characters I1, I2, I3, . . . Im represent individual switches one for each photoconductive element, reference character E represents an electric power source, and reference character $R_L$ represents a load resistor.

Figure 4A:
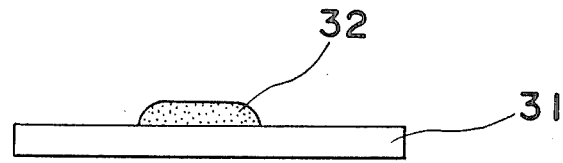
FIGS. 4(a) to 4(c) are diagrams showing different sequential steps of a lift-off method used in the practice of the present invention.
Figure 4B:
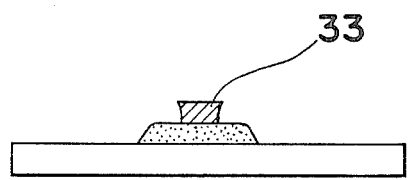
Figure 4C:
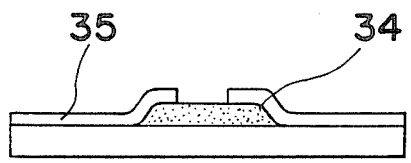

Hereinafter, the method by which the photo-electric converting element is fabricated will be described with particular reference to FIGS. 4(a) to 4(c).

At the outset, a fine crystalline powder of CdSe of 0.2 to 2 μm in particle size (for example, 1 μm in average particle size) having been subjected to an activation process (0.4 mol % $CuCl_2$ doped and treated at 800° C. in $N_2$ atmosphere) was added with 4.5 mol % of $CdCl_2$ and an appropriate quantity of ethylene glycol for viscosity adjustment, and then mixed for 300 hours in a ball mill to provide a paste. The paste so formed was applied by the use of a screen printing technique to a glass substrate 31, which is a #7059 glass manufactured and sold by Corning, U.S.A., to form a photoconductive layer 32, 10 μm in thickness, as shown in FIG. 4(a), and was then sequentially heat-treated, first for 1 hour at 100° C., then for 1 hour at 300° C., and finally for 30 minutes at 500° C., under an $N_2$ atmosphere for sintering, and promoting the growth of, the fine crystalline particles. After the sintering, the photoconductive layer has a layer thickness of 5 μm and a surface roughness of 0.2 μm and also having its peripheral edge tapered outwardly with respect to the substrate 31 at an angle of about 20°. Thereafter, a resist material was coated over both the substrate 31 and the photoconductive layer 32 so as to form a resist layer of about 4 μm in thickness and, after having been exposed to ultraviolet rays of light, the assembly was immersed and developed in a bath of monochlorobenzene for 20 minutes at 25° C. to define a resist pattern 33 as shown in FIG. 4(b). The resist pattern 33 has its peripheral edge tapered inwardly with respect to the photoconductive layer 32 on which it was formed. After the formation of the resist pattern 33, Ti was deposited by the use of a sputtering technique to form a Ti layer of 7000 Å in thickness, followed by the removal in a bath of acetone that portion of the Ti layer which overlays the resist layer thereby to leave pixel electrodes 34 (8 lines/mm in line density) and underlying wirings 35 of the matrix wiring system as shown in FIG. 4(c).

Thereafter, pixel areas and matrix wiring areas were coated with polyimide having a thickness of about 7 μm and contact holes were then formed by the use of a plasma etching technique. Subsequently, for the formation of overlapping wiring areas, Al, Ti and NiCu were deposited to form an Al layer of 2000 Å in thickness, a Ti layer of 3000 Å in thickness, and an NiCu layer of 10000 Å in thickness, respectively, by the use of a DC sputtering technique, which were then formed into the overlaying wirings by the use of a known photolithographic technique, thereby completing the element having 1728 pixels. Since the polyimide layer on the pixel area serves as a protective layer for the photoconductive element, not only will the photoconductive element not be deteriorated during the formation of the overlaying wirings, but also the resistance to the environment can be improved. It is to be noted that, instead of the polyimide layer, $SiO_2$, $Al_2O_3$ or the like can be employed.

When the element fabricated by the use of the above described method was applied with a bias voltage of 12 volts while exposed to incident light of 695 nm wavelength at 64 μW/cm², it could produce a current of 20 μA. The uniformity of the pixels was stabilized at ±10%, and the speed of response to the incident light was below 2 msec. Thus, the method of the present invention is effective to provide a high speed, contact-type image sensor capable of reading information on a real-time basis.

When the photo-electric converting elements having the photoconductive layers of 1 to 10 μm in thickness and 0.2 to 1 μm in surface roughness, with their peripheral edges tapered outwardly with respect to the substrates at an angle not greater than 60°, and also having the counterelectrodes subsequently formed by the use of the lift-off technqiue were manufactured in a manner similar to that described hereinabove in accordance with the present invention, it has been found that the method of the present invention is effective to provide a high yield of elements having no wiring breakdown during the formation of the electrodes and also having the above described characteristics.

As hereinbefore described, according to the present invention, since the screen printing technique is used to apply the photocondutive paste during the manufacture of the photo-electric converting element, the method is applicable to the mass production of the photo-electric converting elements. Moreover, since the electrode formation subsequent to the formation of the photoconductive layer is carried out by the use of the lift-off technique, and since no corrosion of the electrode which would result from the sintering and activation processes effected to the photoconductive layer occurs, both the reliability and the stability are high. Furthermore, since the step delimited between the substrate and the photoconductive layer formed on the substrate is tapered, i.e., formed at a mdoerate angle, a photo-electric converting element which can be satisfactorily used as an element for the contact-type image sensor can be manufactured in high yield and at reduced cost.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of making a photo-electric converting element comprising the steps of:
   forming a photoconductive layer on an insulative substrate by applying to said insulative substrate a photoconductive substance selected from the group consisting of Group II-VI compound semiconductors which include Cd, and mixtures of two or more Group II-VI compound powders;
   baking said photoconductive substance so as to form a photoconductive layer that has
   (1) a thickness of 1 to 10 $\mu$m,
   (2) a surface roughness of 0.2 to 1 $\mu$m, and
   (3) a peripheral edge tapered outwardly with respect to said insulative substrate at an angle not greater than 60°; and
   forming a counterelectrode on said photoconductive layer by the use of a lift-off technique so that said counterelectrode overlays a portion of said photoconductive layer.

2. The method as claimed in claim 1, wherein the meaterial used for the counterelectrode is a single element or an alloy of two or more of Ti, Ta, and Mo.

3. The method as claimed in claim 2, wherein the photoconductive substance is CdSe.

4. The method as claimed in claim 1, wherein the photoconductive substance is CdSe.

5. The method as claimed in claim 1, wherein said photoconductive substance is baked from about 100° to 500° under an atmosphere which causes sintering and promotes crystalline growth.

6. The method as claimed in claim 1, wherein the insulative substrate is Pyrex glass or alumina.

7. The method as claimed in claim 1, wherein said photoconductive substance is a paste and wherein said paste is applied by a screen printing technique.

8. The method as claimed in claim 1, wherein prior to forming said counterelectrode, a resist material is coated on a portion of the photoconductive layer to form a resist layer and, subsequent to forming a counterelectrode, said resist layer is removed.

9. The method as claimed in claim 1, wherein, subsequent to forming said counterelectrode, the photoconductive layer and the counterelectrode are coated with a protective layer.

10. The method as claimed in claim 9, wherein, subsequent to coating a protective layer, contact holes are formed on the photo-electric converting element by use of a plasma etching technique, wiring substances are deposited upon said element by use of a sputtering technique, and overlaying wirings are formed on said element by use of a photolithographic technique.

11. The method as claimed in claim 10, wherein the wiring substances are Al, Ti and NiCu.

12. The method as claimed in claim 10, wherein the protective layer is polyimide and has a thickness of about 7 $\mu$m.

13. The method as claimed in claim 9, wherein the protective layer is polyimide $SiO_2$ or $Al_2O_3$.